(12) United States Patent
Choi et al.

(10) Patent No.: US 11,183,618 B2
(45) Date of Patent: Nov. 23, 2021

(54) LIGHT EMITTING DIODE AND DISPLAY DEVICE COMPRISING THE SAME

(71) Applicant: LG Display Co., Ltd., Seoul (KR)

(72) Inventors: Junghun Choi, Paju-si (KR);
SeungJun Lee, Paju-si (KR); MinJoo Kim, Paju-si (KR); KyuOh Kwon, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 121 days.

(21) Appl. No.: 16/725,229

(22) Filed: Dec. 23, 2019

(65) Prior Publication Data
US 2020/0212268 A1 Jul. 2, 2020

(30) Foreign Application Priority Data
Dec. 26, 2018 (KR) .......................... 10-2018-0169037

(51) Int. Cl.
*H01L 33/50* (2010.01)
*H01L 25/075* (2006.01)
*H01L 33/60* (2010.01)

(52) U.S. Cl.
CPC ........ *H01L 33/505* (2013.01); *H01L 25/0753* (2013.01); *H01L 33/504* (2013.01); *H01L 33/60* (2013.01)

(58) Field of Classification Search
None
See application file for complete search history.

(56) References Cited

U.S. PATENT DOCUMENTS

| 2006/0125388 A1* | 6/2006 | Song | H05B 33/22 313/506 |
| 2018/0190625 A1* | 7/2018 | Steckel | G02F 1/133603 |
| 2020/0303676 A1* | 9/2020 | Lin | H01L 27/322 |

FOREIGN PATENT DOCUMENTS

| KR | 10-0716648 B1 | 5/2007 |
| KR | 10-0786102 B1 | 12/2007 |
| KR | 10-2010-0024231 A | 3/2010 |
| KR | 10-2013-0043858 A | 5/2013 |
| KR | 10-2018-0046494 A | 5/2018 |

* cited by examiner

*Primary Examiner* — Bo B Jang
(74) *Attorney, Agent, or Firm* — Polsinelli PC

(57) ABSTRACT

A light emission element includes a first semiconductor layer, a light emission layer, and a second semiconductor layer. The first semiconductor layer in the light emission portion is provided with a concave portion having a concave shape. The light emission layer and the second semiconductor layer disposed on the first semiconductor layer are also disposed along the concave shape of the concave portion. The light emitting layer disposed along the shape of the concave portion emits light by electrons and holes injected from the first semiconductor layer and the second semiconductor layer. Further, the light path of the light emitted according to the concave shape is adjusted. Therefore, a light emission element having improved light efficiency and a display device using the same can be provided.

20 Claims, 12 Drawing Sheets

LIGHT EMITTING DIODE AND DISPLAY DEVICE COMPRISING THE SAME

CROSS REFERENCE TO RELATED APPLICATION

This application claims the priority of Republic of Korean Patent Application No. 10-2018-0169037 filed on Dec. 26, 2018, which is hereby incorporated by reference in its entirety.

BACKGROUND

Field of the Disclosure

The present disclosure relates to a light emission element and a display device including the light emission element, and more particularly, to a light emission portion and a light emission element that can be improved in terms of emission efficiency by using a light emission layer as a concave portion and a display device including the same.

Description of the Background

Display devices are widely used as display screens of laptop computers, tablet computers, smart phones, portable display devices, and portable information devices in addition to display devices of televisions or monitors.

The display device can be classified into a reflective type display device and a light emitting type display device. The reflective type display device is a display device in which ambient light or light emitted from external light source of a display device is reflected on a display device to display information. The light emitting type display device is a display device in which a light emission element or a light source is included in a display device and information is displayed by light emitted from the light emission element or the light source.

The light emission element included in the display device may be realized as a light emission element capable of emitting various wavelengths of light or a light emission element capable of emitting white or blue light with a color filter capable of filtering the wavelength of the emitted light.

In order to realize an image with a display device, a plurality of light emission elements is disposed on a substrate of a display device and a plurality of driving elements for supplying driving signals or driving currents for controlling the individual light emission of each light emission element are disposed on the substrate with the light emission elements. Further, analyzing in accordance with an arrangement of the information to be displayed by an array of the plurality of light emission elements arranged on the substrate so as to be displayed on a substrate.

In other words, a plurality of pixels may be arranged in a display device. Each pixel may use a thin film transistor as a switching element which is a driving element. The pixel may be driven by being connected to the thin film transistor. Therefore, the display device may display an image by the operation of each pixel.

Representative display devices using thin film transistors include liquid crystal display devices and organic light emission display devices. Since the liquid crystal display device is not a self-emitting type, a backlight unit configured to emit light at a lower portion (rear surface) of the liquid crystal display device is required. With this additional backlight unit, the thickness of the liquid crystal display device is increased, and there are restrictions to implement the display device in various forms of design such as flexible or circular, and the luminance and response speed may be lowered.

SUMMARY

It is advantageous that a display device including a self-luminous element can be realized to be thinner than a display device having an additional light source, and it can be realized as a flexible and foldable display device.

A display device having such a self-luminous element may be an organic light emission display device including an organic material as a light emission layer, a micro-LED display device using a micro-LED as a light emission element, and the like. A self-luminous display device such as an organic light emission display device or a micro-LED display device can be utilized as a thinner and more diverse display device because no additional light source is required.

Organic light emission display devices using organic materials do not require an additional light source, but are vulnerable to moisture and oxygen that can cause defective pixels. Therefore, various technics are required to suppress penetration of oxygen and moisture.

In recent years, research and development have been made on a display device using a micro-sized light emitting diode as a light emission element, and such a light emission display device has superior image quality and superior reliability. Therefore, such display device has been regarded as a next generation display device.

An LED element is a semiconductor light emission element that emits light when a current is provided to the semiconductor, and is widely used for lighting, TV, and various display devices. The LED element may be made of an n-type semiconductor layer and a p-type semiconductor layer, and an active layer is interposed therebetween. When a current is supplied, electrons around the n-type semiconductor layer and holes around the p-type semiconductor layer are combined in the active layer thereby emit light.

There are several technical requirements for implementing a light emission display device in which an LED element is used as a light emission element of a unit pixel. First, an LED element is crystallized on a semiconductor wafer substrate such as sapphire or silicon (Si). Then, the plurality of crystallized LED chips is transplanted to the substrate having the driving element. At this time, a sophisticated transplanting step of positioning the LED element at a position corresponding to each pixel is required.

The LED element can be formed using an inorganic material, but it needs to be formed by crystallization. In order to crystallize an inorganic material such as GaN, the inorganic material must crystallize on a substrate capable of inducing crystallization. The substrate on which the crystallization of the inorganic material can efficiently be induced is a semiconductor substrate, and the inorganic material should be crystallized on the semiconductor substrate as described above.

The process of crystallizing the LED element may be referred to as epitaxy, epitaxial growth, or an epitaxial process. An epitaxial process refers to a process in which a specific orientation relationship is taken on the surface of a crystal to grow. In order to form an element structure of an LED element, a GaN compound semiconductor must be stacked on a substrate in the form of a PN junction diode. At this time, each layer is grown by inheriting the crystallinity of the underlying layer.

At this time, some defect inside the crystal may act as a nonradiative center in the electron-hole recombination process. Therefore, in an LED element using a photon, the crystallinity of the crystals forming each layer has a crucial influence on the device efficiency.

The sapphire substrate described above is mainly used as a substrate at present. In recent years, researches on substrates based on GaN have been actively conducted.

As described above, the cost of a semiconductor substrate, required for crystallizing an inorganic material such as GaN configuring an LED element on a semiconductor substrate, is high. Accordingly, when a large number of LEDs are used as the light emitting pixels of the display device other than the LEDs of the light sources used for the simple illumination or the backlight, the manufacturing cost is increased, which can be a problem.

In addition, as described above, the step of transferring the LED element formed on a semiconductor substrate to a substrate of the display device is required. In this process, it is difficult to separate the LED elements formed on the semiconductor substrate. Also, there are many difficulties and problems when transplanting the separated LED elements to a desired location.

Methods for transplanting LED elements formed on a semiconductor substrate to a substrate of a display device such as a transplant method using a transplant substrate using a polymer material such as PDMS, a transplant method using an electromagnetic or electrostatic charge, or the like transplant methods for picking up and moving each element can be used. Researches on various transplant methods have been conducted.

Such a transplant process is related to the productivity of the process of implementing the display device, and the method of transplanting the LED element one by one for mass production may be inefficient.

Accordingly, a sophisticated transplant process or a method is required for precisely placing a plurality of LED elements on a substrate of a display device, in particular, on a driving electrode arranged on a thin film transistor and a pad electrode connected to the power electrode, which are separated from a semiconductor substrate by using a transplant substrate using a polymer material.

During the above-described transplant process or the subsequent process after the transplant process, defects may occur because some of the LED elements may be shifted or flipped over due to vibration or heat condition during the transplant process and there were many difficulties in finding and recovering these defects.

A general LED element transplant process will be described as an example. An LED element is formed on a semiconductor substrate and an electrode is formed on a semiconductor layer to manufacture an individual LED element. Thereafter, the semiconductor substrate and the PDMS substrate (hereinafter referred to as a transplant substrate) are brought into contact with each other to move the LED elements to the transplant substrate. The LED elements formed on the semiconductor substrate should be transplanted from the semiconductor substrate to the transplant substrate in consideration of the pixel pitch of the pixel. Therefore, on the transplant substrate, a protruding shape or the like for receiving the LED element is disposed so as to protrude in consideration of the pixel pitch of the display device.

The LED element is detached from the semiconductor substrate by irradiating a laser to the LED element through the back surface of the semiconductor substrate, which is referred to as the first transplant. At this time, when the LED element is separated from the semiconductor substrate in the process of irradiating the laser, the GaN material of the semiconductor substrate may be physically and rapidly expanded due to the energy concentration of the high energy of the laser. Therefore, an impact may occur.

Thereafter, the LED element transferred to the transplant substrate is transplanted onto a substrate of a display device. A protective layer for insulating and protecting the thin film transistor is disposed on a substrate having the thin film transistor then an adhesive layer is disposed on the protective layer.

When the transplant substrate is brought into contact with the substrate of the display device to apply pressure, the LED element transferred to the transfer substrate is transplanted to the substrate of the display device by the adhesive layer on the protective layer.

At this time, the adhesive force between the transplant substrate and the LED element is made smaller than the adhesive force between the substrate of the display device and the LED element, so that the LED element on the transplant substrate is smoothly transplanted to the substrate of the display device, which is referred to as the second transplant.

The substrates of the semiconductor substrate and the display device are fundamentally different in size, and the substrate of the display device is usually large.

If the above-described first and second transplants are repeatedly performed for a plurality of areas of the substrate of the display device due to such difference in area and size, the LED elements corresponding to each pixel of the display device can be transplanted.

The LED element formed on the semiconductor substrate may be an LED element of red light, green light and blue light depending on the type thereof, or may be a white LED element. The number of first and second transplant described above can be further increased in the method of implementing pixels of a display device by using an LED element emitting light of different wavelengths.

On the other hand, a display device which does not require a transplant step using the above-described LED element but uses a transplant substrate or the like can be provided according to the field of use of the display device.

A display device that does not require a transplant process may be a display device for VR (Virtual Reality) or AR (Augmented Reality). Unlike a general display device, such a display device should have a very small display device size and a high degree of integration of the light emission element. Therefore, the LED element formed on the semiconductor substrate can be used as it is without being transplanted to another substrate by a transplant process.

In addition, an LED element is grown on a semiconductor substrate. Further, a light emitting area where the light emission element is located and a circuit area where the drive circuit is located are divided to form an LED element and to dispose a thin film circuit or a driving circuit for driving the light emitting area in a circuit area to realize a display device.

The LED element is made of a compound semiconductor such as GaN, and can inject a high current due to the characteristics of an inorganic material, thereby realizing a high brightness and has high reliability due to high environmental impact tolerance such as heat, moisture and oxygen.

In addition, since the internal quantum efficiency of the LED element is higher than that of the organic light emission display device at the level of 90%, There are advantages that a display device with low power consumption can be realized while displaying a high-luminance image.

In addition, unlike an organic light emission display device, it uses inorganic materials. Thus, a separate encapsulation film or an encapsulation substrate may not be required to minimize penetration of oxygen and moisture as it has little influence of oxygen and moisture. Therefore, there is an advantage that the non-display area of the display device, which is a margin area that may be required when disposing the encapsulation film or the encapsulation substrate, can be minimized.

However, since the LED element has a structure in which it is difficult to control the light path of the light emitted by itself, a configuration for efficiently increasing the light efficiency of the LED element may be additionally required.

Also, when the above-described LED element is transplanted to another substrate of the display device, as the size of the LED element becomes smaller, the LED element may not be transplanted to an intended position in the step of arranging the LED element, and thus a defect may occur in the transplant step.

In recent years, many research activities have been conducted on a light emission element and a display device using the light emission element which can improve the light efficiency and minimize the defective manufacturing process.

As described above, the LED element has a problem that it is difficult to control the light path of the light emitted from the light emission layer, and thus the light efficiency may be lowered. In addition, there is a problem that the LED element as the light emission element to be transplanted to the display device may be flipped over in the process of the transplant. Accordingly, the inventors of the present disclosure have invented a light emission element and a display device using the same that can minimize the defective rate of the transplant step and increase the light efficiency by adjusting the shape of the light emission portion.

According to an aspect of the present disclosure, an object of the present disclosure is to provide a light emission element in which light emission portions are arranged in a concave shape to improve light efficiency and a display device using the same.

According to an aspect of the present disclosure, an object of the present disclosure is to provide a light emission element and a display device using the same that can improve process reliability and productivity during a process of transplanting a light emission element.

The problems according to an aspect of the present disclosure are not limited to the above-mentioned problems, and other problems not mentioned can be clearly understood by those skilled in the art from the following description.

A light emission element having increased light efficiency according to an aspect of the present disclosure is provided. At least one concave portion is disposed in the first semiconductor layer, and a light emission layer is disposed on the first semiconductor layer along the concave portion. Further, the second semiconductor layer is disposed along the concave shape of the concave portion from the first semiconductor layer to the light emission layer and the second semiconductor layer on the light emission layer and a color filter or a color conversion layer disposed on the second semiconductor layer inside the concave portion. Also, the light emission layer and the second semiconductor layer are disposed on the first semiconductor layer inside the concave portion, and an upper surface of the color filter or the color conversion layer is coplanar with upper surface of each of both ends of the first semiconductor layer, the light emission layer and the second semiconductor layer. Therefore, the light efficiency of the light emission element is increased.

There is provided a display device with increased light efficiency according to an aspect of the present disclosure. At least one driving element is disposed on a substrate and a light emission element whose light emission is controlled by the driving element is disposed. The light emission element includes at least one light emission portion, and the light emission portion is configured of a first semiconductor layer, a light emission layer disposed on the first semiconductor layer, a second semiconductor layer, and a color filter or a color conversion layer disposed on the second semiconductor layer. The light emission portion may include a concave portion to increase light efficiency by controlling an optical path of light emitted from the light emission layer. The light emission element may include a plurality of light emission portions, and each light emission portion corresponds to a pixel. Further the light emission layer, the second semiconductor layer and the color filter or the color conversion layer are sequentially disposed on the first semiconductor layer inside the concave portion, and an upper surface of the color filter or the color conversion layer is coplanar with upper surface of each of both ends of the first semiconductor layer, the light emission layer and the second semiconductor layer.

Thus, the number of elements to be transplanted can be reduced, thereby reducing the defective rate of the transplant process and improving the productivity. By using the light emission element having at least one light emission portion, it is possible to provide a display device with improved light efficiency and improved productivity.

According to the aspect of the present disclosure, the light efficiency of the light emission element can be increased by providing the concave portion on the light emission element. Further, by using the light emission element having the concave portion, the light efficiency of the display device can be increased.

Further, according to another aspect of the present disclosure, the light emission element having a plurality of concave portions is provided, thereby simplifying the manufacturing process and improving the process stability.

The effects of the present disclosure are not limited to the effects mentioned above, and other effects not mentioned can be clearly understood by those skilled in the art from the following description.

It should be noted that the contents of the present disclosure described in the problems, the solutions to the problems, and the effects described above do not specify essential features of the claims. Accordingly, the scope of the claims is not limited to what is described in the description of the present disclosure.

BRIEF DESCRIPTION OF THE DRAWINGS

The accompanying drawings, which are included to provide a further understanding of the disclosure and are incorporated in and constitute a part of this disclosure, illustrate aspects of the disclosure and together with the description serve to explain the principles of the disclosure.

In the drawings.

DETAILED DESCRIPTION

Figure 1:
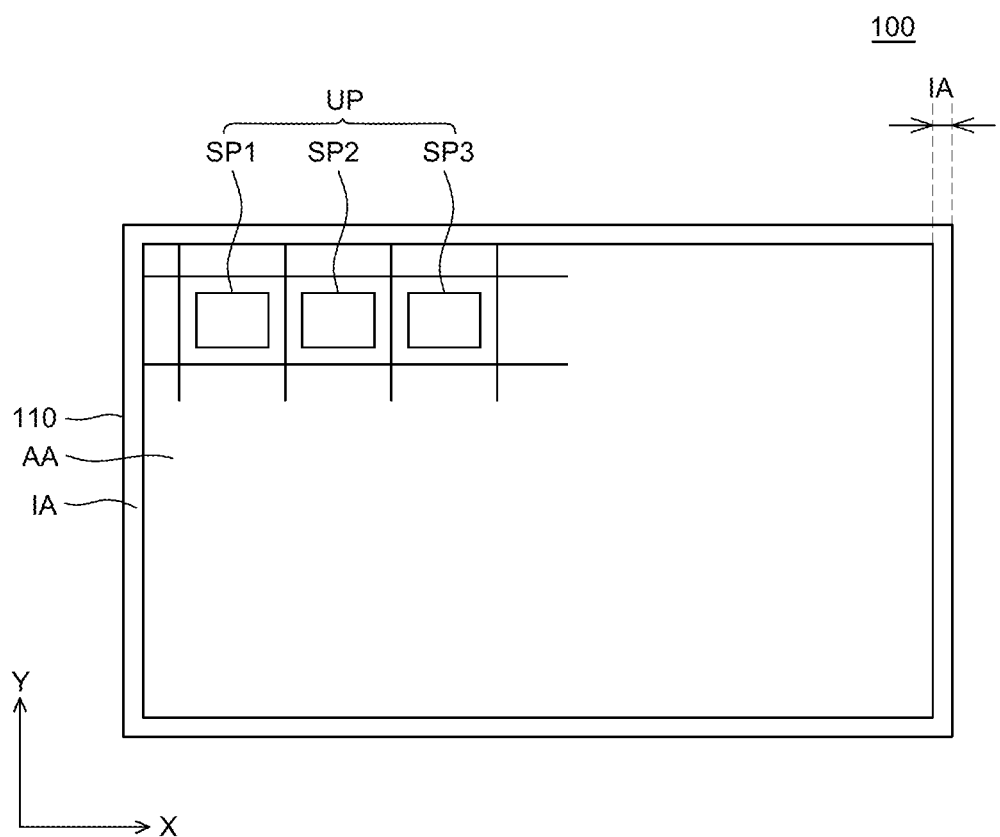
FIG. 1 is a schematic view illustrating a light emission element and a display device using the same according to an aspect of the present disclosure.

Advantages and characteristics of the present disclosure and a method of achieving the advantages and characteristics will be clear by referring to the aspects described below in detail together with the accompanying drawings. However, the present disclosure is not limited to the aspect disclosed herein but will be implemented in various forms. The aspects are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range (e.g., a tolerance range) even if not expressly stated.

When the position relation between two elements is described using the terms such as "on", "above", "below", and "next", one or more elements may be positioned between the two parts unless the terms are used with the term "immediately" or "directly".

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Each of the features of the various aspects of the present disclosure can be combined or combined with each other partly or entirely. The features of the various aspects can be technically interlocked and driven as well. The features of the various aspects can be practiced independently or in conjunction with each other independently of each other.

Hereinafter, various aspects of the present disclosure will be described in detail with reference to accompanying drawings.

FIG. 1 is a schematic view illustrating a light emission element and a display device using the same according to an aspect of the present disclosure.

Referring to FIG. 1, a display device 100 according to an aspect of the present disclosure includes a display area AA having a plurality of unit pixels UP and a substrate 110 defining a non-display area IA.

The unit pixel UP may be configured of a plurality of pixels SP1, SP2 and SP3 on one side of the substrate 110. The pixels SP1, SP2, and SP3 may be typically emit red light, green light, and blue light. However, the present disclosure is not limited thereto, and may include a pixel emitting white light.

The substrate 110 is a thin film transistor array substrate, and may be made of glass or plastic. The substrate 110 may be a laminate of two or more substrates or a substrate 110 divided into two or more layers. The non-display area IA may be defined as an area on the substrate 110 except for the display area AA, which may have a relatively narrow width, and may be defined as a bezel area.

Each of the plurality of unit pixels UP is arranged in the display area AA. At this time, each of the plurality of unit pixels UP is arranged in the display area AA so as to have a predetermined first reference pixel distance along the X-axis direction and a predetermined second reference pixel distance along the Y-axis direction. The first reference pixel distance may be defined as a distance between the central portions of adjacent unit pixels UP. Likewise, the second reference pixel distance may be defined as a distance between the central portions of adjacent unit pixels UP along the reference direction.

On the other hand, the distances between the pixels SP1, SP2 and SP3 configuring the unit pixel UP may be also defined as the first reference sub-pixel distance and the second reference sub-pixel distance similar to the first reference distance and the second reference distance.

The display device 100 including the LED element as the light emission element may have a width of the non-display area IA smaller than the above-described pixel distance or sub-pixel distance. When the multi-screen display device is realized with the display devices 100 having the non-display area IA having a width equal to or shorter than the pixel distance or the sub-pixel distance, the non-display area IA is smaller than the pixel distance or the sub-pixel distance. Thus, a multi-screen display device having substantially no bezel area can be realized.

As described above, in order to implement a multi-screen display device in which the bezel area is substantially absent or minimized, the display device 100 may keep the first reference pixel distance, the second reference pixel distance, the first reference sub-pixel distance, and the second reference sub-pixel distance constant in the display area AA. Alternatively, the display area AA may be defined as a plurality of areas and the above-described distances are made different from each other in each area, and the pixel distance of the area adjacent to the non-display area IA may become wider than the other areas. Therefore, the size of the bezel area can be made even smaller than the pixel distance.

Thus, the display device 100 having different pixel distances may cause a distortion phenomenon with respect to an image. Accordingly, image processing may be performed by sampling the image data in comparison with the adjacent area in consideration of the set pixel distance, thereby minimizing the distortion of the image and minimizing the bezel area.

Figure 2A:
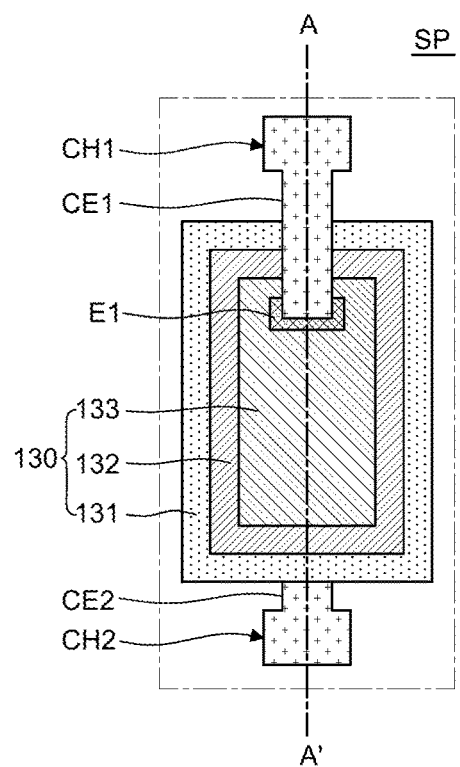
FIG. 2A is a schematic view illustrating a light emission element used in a display device according to an aspect of the present disclosure.
Figure 3:
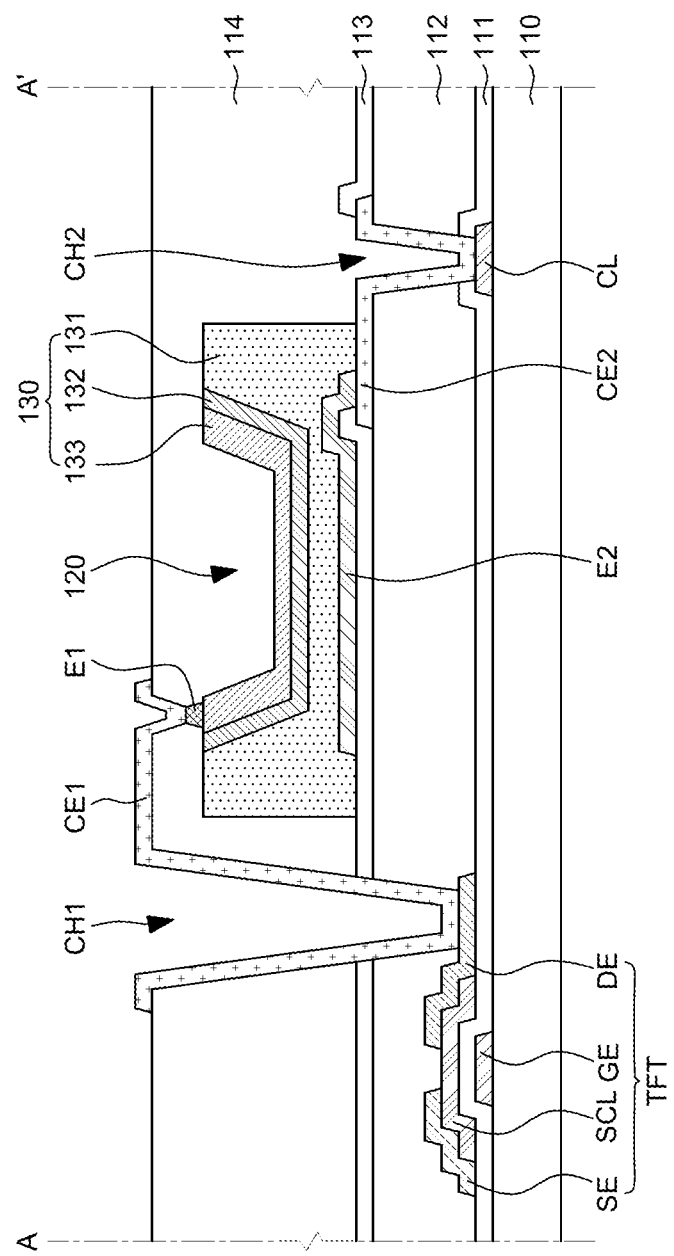
FIG. 3 is a schematic cross-sectional view taken along line A-A' of FIG. 2A for explaining a display device according to an aspect of the present disclosure.

FIG. 2A is a schematic view illustrating a light emission element used in a display device according to an aspect of the present disclosure. FIG. 3 is a schematic cross-sectional view taken along line A-A' of FIG. 2A for explaining a display device according to an aspect of the present disclosure.

For convenience of explanation, FIG. 2A and FIG. 3 will be described together. The pixel SP in the unit pixel includes the light emission element 130 including the first semiconductor layer 131, the light emission layer 132, and the second semiconductor layer 133. In order to supply current to the light emission element 130, the first electrode E1 and the second electrode E2 are disposed in the light emission element 130, and the first connection electrode CE1 and the second connection electrode CE2 connected to the respective electrodes are extended to the first contact hole CH1 and the second contact hole CH2.

The first electrode E1 is electrically connected to the second semiconductor layer 133 and the second electrode E2 is electrically connected to the first semiconductor layer 131. The first electrode E1 is electrically connected to the second semiconductor layer 133 and the light emission layer 132 and the first semiconductor layer 131 are electrically insulated. For this configuration, the light emission element 130 may further include an insulating layer (not shown).

The structure described above is an example in which the light emission element 130 is transplanted onto the substrate 110 as an example for explaining the present disclosure. Further, aspects in which a semiconductor layer or the like is grown on a semiconductor substrate and used as a light emission element are also possible according to the following aspects.

Figure 2B:
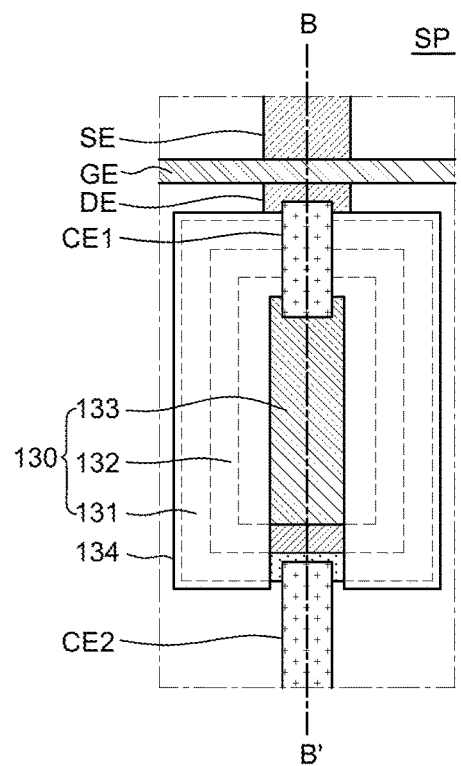
FIG. 2B is a schematic view for explaining a display device according to another aspect of the present disclosure.
Figure 4:
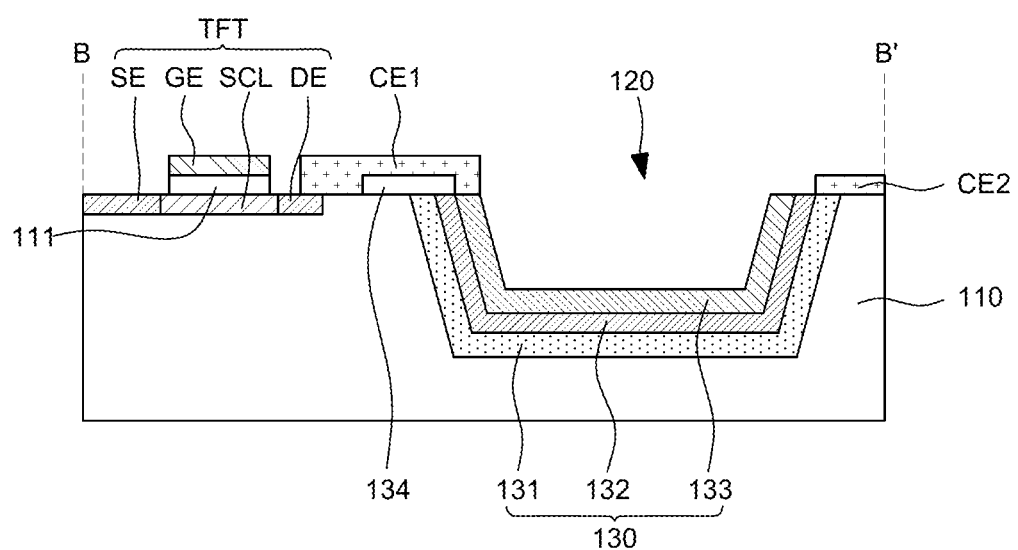
FIG. 4 is a schematic cross-sectional view taken along line B-B' of FIG. 2B for explaining a display device according to another aspect of the present disclosure.

FIG. 2B is a schematic view for explaining a display device according to another aspect of the present disclosure. FIG. 4 is a schematic cross-sectional view taken along line B-B' of FIG. 2B for explaining a display device according to another aspect of the present disclosure.

Another aspect using the light emission element 130 grown on a semiconductor substrate different from an aspect of the light emission element 130 to be transplanted will be described with reference to FIG. 4.

The substrate 110 may be a sapphire substrate or a silicon substrate as a semiconductor substrate capable of growing a semiconductor layer such as a first semiconductor layer 131, a light emission layer 132, and a second semiconductor layer 133. The first semiconductor layer 131 is selectively grown on the semiconductor substrate, and then the light emission layer 132 and the second semiconductor layer 133 are continuously grown on the selectively grown first semiconductor layer 131.

The first semiconductor layer 131 is electrically connected to the second connection electrode CE2 and the second semiconductor layer 133 is electrically connected to the first connection electrode CE1. Although, the first connection electrode CE1 is electrically connected to the second semiconductor layer 133, the first semiconductor layer 131 and the light emission layer 132 are insulated. For this, the insulating layer 134 may be further formed under the first connection electrode CE1.

The substrate 110 is a substrate made of a semiconductor material and can be partially doped to change the conductivity. Therefore, an electrode having a high electrical conductivity such as the source electrode SE and the drain electrode DE can be disposed on the substrate 110.

On the other hand, the gate insulating layer 111 is disposed on the semiconductor channel SCL connected to the source electrode SE and the drain electrode DE. A gate electrode GE may be disposed on the gate insulating layer 111 to arrange a thin film transistor TFT on the substrate 110.

The semiconductor channel SCL is a layer configured to allow a current to flow between a source electrode SE and a drain electrode DE, on which a channel capable of moving charges between two electrodes is formed, by an electrical signal applied to the gate electrode GE. For this, a doping process can be performed.

The doping process is a process of injecting various impurities to control a threshold voltage at which a charge can flow, and impurities used may vary according to a required threshold voltage or the like.

Hereinafter, various configurations of the light emission element including the concave portion and the display device using the same will be described with reference to the previous drawings.

FIG. 3 is a schematic cross-sectional view taken along line A-A' of FIG. 2A for explaining a display device according to an aspect of the present disclosure.

Referring to FIG. 3, the thickness of the substrate 110 is illustrated relatively thin. However, the thickness of the substrate 110 may be substantially thicker than the total thickness of the layer structure provided on the substrate 110, or may be configured of a plurality of layers, or a substrate comprising a plurality of laminated substrates.

The thin film transistor TFT includes a gate electrode GE, a semiconductor channel SCL, a source electrode SE, and a drain electrode DE.

The gate electrode GE may be disposed on the substrate 110 together with the common electrode CL. The gate electrode GE is covered with a gate insulating layer 111. The gate insulating layer 111 may be formed of a single layer or a plurality of layers made of an inorganic material, and may be formed of silicon oxide (SiOx), silicon nitride (SiNx), or the like.

The semiconductor channel SCL is provided in the form of a predetermined pattern or an island shape on the gate insulating layer 111 so as to overlap with the gate electrode GE. Such a semiconductor channel SCL may be made of a semiconductor material including at least one among amorphous silicon, polycrystalline silicon, oxide and organic material, but is not limited thereto.

The source electrode SE is disposed so as to overlap with one side of the semiconductor channel SCL. The drain electrode DE is disposed so as to be spaced apart from the source electrode SE while overlapping with the other side of the semiconductor channel SCL. The drain electrode DE may be disposed together with the source electrode SE. The source electrode SE and the drain electrode DE may be electrically connected or branched to a power supply line or a signal line.

The protective layer 112 is provided over the entire surface of the substrate 110 so as to cover the driving transistor TFT or the like configuring the pixel SP. This protective layer 112 protects the driving transistor TFT and various electrodes and provides a flattened surface. The protective layer 112 according to an aspect of the present disclosure may be made of an organic material such as benzocyclobutene or photo acryl. For convenience of the process, it may be made of a photo acrylic material.

The light emission element 130 according to an aspect of the present disclosure may be disposed by using an adhesive member 113 on a protective layer 112. Alternatively, the protective layer 112 may further include a reflective layer (not shown) to reflect light emitted from the light emission element 130. In addition, the light emission element 130 may have various curved shapes to accommodate the light emission element 130.

The light emission element 150 emits light by the current flowing from the thin film transistor TFT to the common electrode CL. The light emission element 130 according to an aspect of the present disclosure further includes a light emission layer EL, a first electrode E1 or an anode terminal, and a second electrode E2 or a cathode terminal. The second electrode E2 may be a reflective electrode that reflects light.

The first electrode E1 and the second electrode E2 are configured to electrically connect the first semiconductor layer 131 and the second semiconductor layer 133 in the above-described structure. Therefore, the first connection electrode CE1 and the second connection electrode CE2 may be directly connected to the first semiconductor layer 131 and the second semiconductor layer 133, and thus these may be omitted.

The planarization layer 114 is disposed on the protective layer 112 so as to cover the light emission element 130. The planarization layer 114 may be a single layer disposed on the protective layer 112, or it may be a multi-layered structure so as to have a thickness enough to cover both the front surface of the protective layer 112 and the place where the light emission element 130 is disposed and the rest of the front surface.

As such, the planarization layer 114 provides a planar surface on the protective layer 112. In addition, the planarization layer 114 serves to fix the position of the light emission element 130.

The first connection electrode CE1, connects the first electrode E1 of the light emission element 130 to the drain electrode DE of the thin film transistor TFT. Further, it can connect the source electrode SE according to the structure of the thin film transistor TFT and it may be defined as an anode electrode.

The first connection electrode CE1 according to an aspect of the present disclosure is electrically connected to the drain electrode DE or the source electrode SE of the thin film transistor TFT through the first contact hole CH1 provided through the protective layer 112 and the planarization layer 114 and extended to the first electrode E1 so as to be electrically connected.

Thus, the first electrode E1 of the light emission element 130 is electrically connected to the drain electrode DE or the source electrode SE of the thin film transistor TFT through the first connection electrode CE1.

In the connection relationship of the source electrode SE and the drain electrode DE, it is illustrated that the drain electrode DE is connected to the first connection electrode CE1. However, the first connection electrode CE1 and the source electrode SE can be connected to each other. That is, such configurations are options of a person skilled in the art.

The first connection electrode CE1 may be formed of a transparent conductive material when the display device is a top-emission type and may be made of a reflective conductive material when the display device is a bottom-emission type. Here, the transparent conductive material may be indium tin oxide (ITO), indium zinc oxide (IZO), or the like, but is not limited thereto. The reflective conductive material may be Al, Ag, Au, Pt, Cu, or the like, but is not limited thereto. The first connection electrode CE1 made of a reflective conductive material may be a single layer including a reflective conductive material or a multilayer including the single layer.

The common electrode CL is connected to the second electrode E2 of the light emission element 130 and may be defined as a cathode electrode. The second connection electrode CE2 electrically connects the common electrode CL and the second electrode E2. Further, the common electrode CL and the second electrode E2 are electrically connected through the second contact hole CH2 on the protective layer 112.

In the display device according to an aspect of the present disclosure, the light emission element 130 mounted on each pixel SP may be fixed by an adhesive member 113.

The adhesive member 113 primarily fixes the light emission element 130 of each pixel SP. The adhesive member 113 according to an aspect of the present disclosure is in contact with the lower portion of the light emission element 130 so as to minimizes the positional deviation of the light emission element 130 during the transplant process and easily separate the light emission element 130 from the intermediate substrate, thereby minimizing defects in the transplant process of the light emission element 130.

The adhesive member 113 according to an aspect of the present disclosure can be adhered to the bottom of the light emission element 130 by being dotted on each pixel SP and spread by the pressing force applied in the mounting process of the light emission element. Accordingly, the light emission element 130 can be primarily fixed in position by the adhesive member 113. Therefore, according to the present aspect, the mounting process of the light emission element can be performed by simply adhering the light emission element 130 to a surface, thereby the mounting process time of the light emission element can be greatly shortened.

In addition, the adhesive member 113 is interposed between the protective layer 112 and the planarization layer 114 and the adhesive layer 113 is interposed between the light emission element 130 and the protective layer 112. The adhesive member 113 according to this other example is coated on the entire front surface of the protective layer 112 with a uniform thickness. However, a portion of the adhesive member 113 coated on the entire surface of the protective layer 112 on which the contact holes are to be formed is removed for the contact holes. Accordingly, an aspect of the present disclosure, the adhesive member 113 is coated on the entire front surface of the protective layer 112 to a uniform thickness immediately before the mounting process of the light emission element, thereby shortening the process time for disposing the adhesive member 113.

The light emission element 130 includes a first semiconductor layer 131, a light emission layer 132, and a second semiconductor layer 133. The first semiconductor layer 131 is electrically connected to the second electrode E2 and the second semiconductor layer 133 is electrically connected to the first electrode E1.

Further, the concave portion 120 is defined in the light emission element. The boundary between the first semiconductor layer 131, the light emission layer 132, and the second semiconductor layer 133 have substantially the same concave shape according to the concave shape of the concave portion 120.

The concave shape of the concave portion 120 may be a square, an inverted trapezoid shape, or a semicircular shape having a larger diameter of the opened upper end portion with respect to a cross section. The light emission layer 132 disposed along the concave shape of the concave portion 120 emits light by electrons and holes injected from the first semiconductor layer 131 and the second semiconductor layer 133 and the light path can be adjusted according to the concave shape of the concave portion 120.

Since the light path is adjusted according to the concave shape of the concave portion 120, the light efficiency of the light emission element 130 can be increased and for further improvement, a reflective layer that reflects light can be further disposed below the first semiconductor layer 131 to increase the efficiency even more.

FIG. 4 is a schematic cross-sectional view taken along line B-B 'of FIG. 2B for explaining a display device according to another aspect of the present disclosure.

In an aspect of the display device for explaining the present disclosure, the light emission element 130 is formed as a light emission element grown on a wafer and it needs a transplant process for transferring to a substrate of a display device. FIG. 4 illustrates an aspect of the present disclosure as an example of a display device that does not require a transplant process.

First, the substrate 110 is a crystalline silicon or sapphire-based semiconductor wafer that can grow unidirectional single crystals such as the first semiconductor layer 131, the light emission layer 132, and the second semiconductor layer 133. In addition, the threshold voltage that allows current flow of the semiconductor layer having a semiconductor characteristic can be adjusted by appropriately doping impurities or the like, thereby forming a semiconductor layer or a conductive layer such as an electrode.

Hereinafter, another aspect of the present disclosure will be described with reference to FIG. 4, which will be described with reference to the previous drawings.

As described above, the substrate 110 is a semiconductor wafer, and a thin film transistor TFT is disposed on the substrate 110. The source electrode SE and the drain electrode DE of the thin film transistor TFT can be disposed by performing the surface treatment to the surface of the substrate 110. The semiconductor channel SCL is also doped appropriately in accordance with the driving specification of the thin film transistor TFT and the gate insulating layer 111 and the gate electrode GE are disposed on the semiconductor channel SCL to form the thin film transistor TFT.

On the other hand, the light emission element 130 includes single-crystal structures that can be grown from the substrate 110. Accordingly, the light emission element 130 can use such characteristic. Accordingly, the first semiconductor layer 131, the light emission layer 132, and the second semiconductor layer 133 are epitaxially grown and disposed. When the first semiconductor layer 131, the light emission layer 132, and the second semiconductor layer 133 are grown, the lattice directions of the first semiconductor layer 131, the light emission layer 132, and the second semiconductor layer 133 are determined in accordance with the lattice direction of the surface of the substrate 110. Further, a buffer layer capable of controlling the lattice direction may be included.

The drain electrode DE of the thin film transistor TFT disposed on the substrate 110 is electrically connected to the second semiconductor layer 133 of the light emission element 130 through the first connection electrode CE1. At this time, the first connection electrode CE1, the first semiconductor layer 133, and the light emission layer 132 may be insulated by the insulating layer 134.

The above-described display device can directly form and arrange a thin film transistor and a driving element for driving on a substrate while utilizing a semiconductor substrate as a substrate of a display device. Therefore, a transplant step for a separate light emission element is not required. In addition, since a pixel can be realized with more sophisticated and finer size than a conventional display device by utilizing a semiconductor process, thereby an ultra-high-quality display device applicable to VR or AR can be realized.

Hereinafter, a light emission element having increased light efficiency according to various aspects of the present disclosure and its configuration will be described in detail with reference to the accompanying drawings.

Figure 5A:
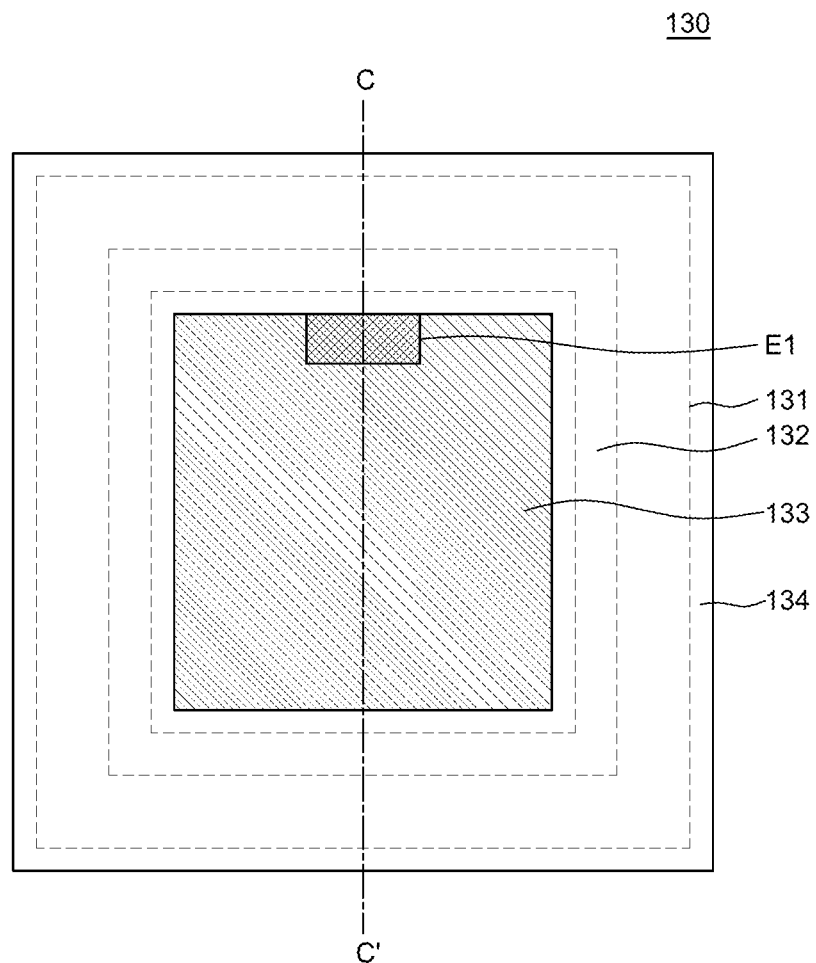
FIG. 5A is a schematic view illustrating a light emission element according to an aspect of the present disclosure.
Figure 5B:
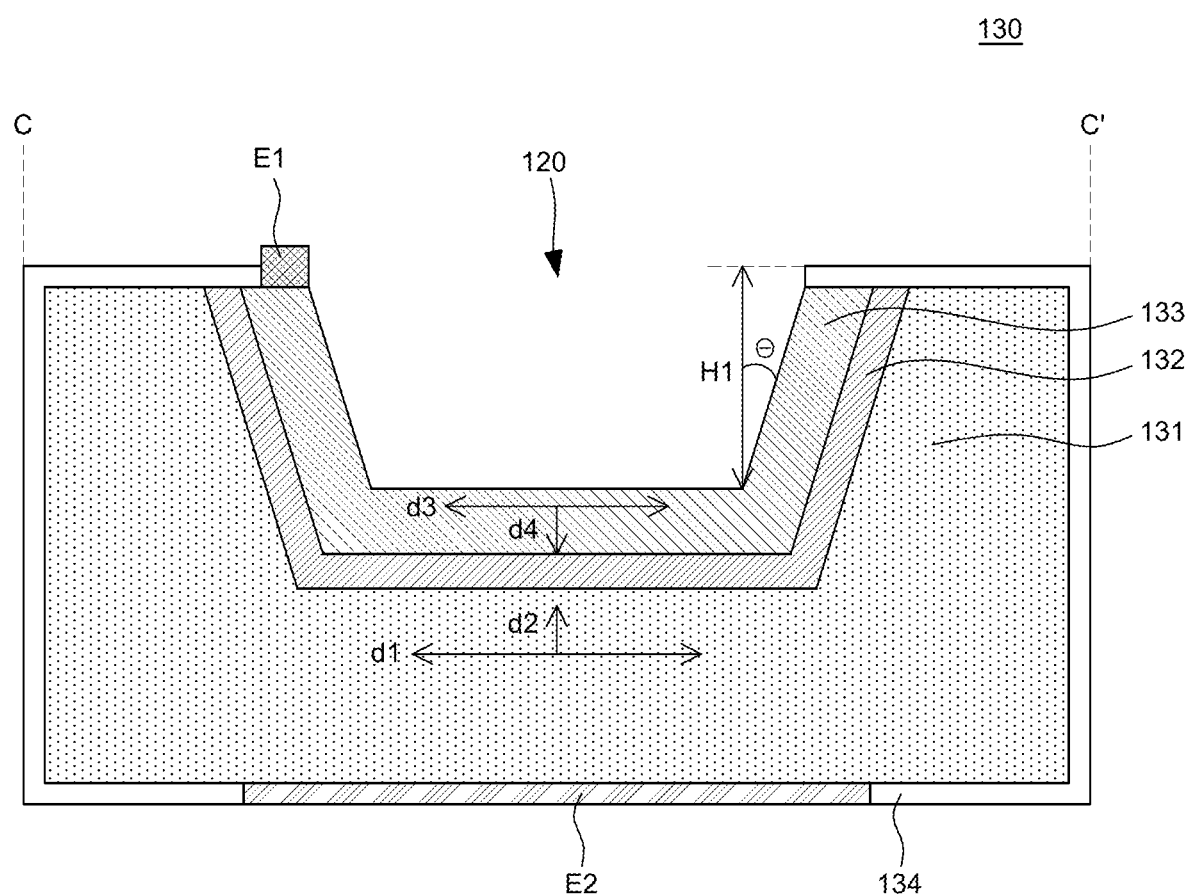
FIG. 5B is a schematic cross-sectional view taken along line C-C' of FIG. 5A for explaining a light emission element according to an aspect of the present disclosure.

FIG. 5A is a schematic view illustrating a light emission element according to an aspect of the present disclosure. FIG. 5B is a schematic cross-sectional view taken along line C-C 'of FIG. 5A for explaining a light emission element according to an aspect of the present disclosure.

The light emission element 130 according to an aspect of the present disclosure includes a first semiconductor layer 131, a light emission layer 132, a second semiconductor layer 133, a first electrode E1, a second electrode E2, and an insulating layer 134. The light emission element 130 emits light according to the recombination of electrons and holes according to the current flowing between the first electrode E1 and the second electrode E2.

The first semiconductor layer 131 may be an n-type semiconductor layer and the second semiconductor layer 133 may be a p-type semiconductor layer. Further, for convenience, regardless of its type, it will be described as the first semiconductor layer 131 and the second semiconductor layer 133. Also, according to an electrical connection relationship, that is, depending on a semiconductor layer that forms an electrical connection, the first electrode E1 and the second electrode E2 may be referred to as a p-type electrode or an n-type electrode. Similarly, for convenience, regardless of its type, it will be described as the first electrode or the second electrode. Further, in this specification, the first semiconductor layer 131 and the second semiconductor layer 153 may be referred to as an n-type semiconductor layer and a p-type semiconductor layer, respectively. However, the first semiconductor layer 131 and the second semiconductor layer 133 may be the opposite n-type semiconductor layer and the p-type semiconductor layer, respectively.

The second semiconductor layer 133 is provided on the light emission layer 132 to provide holes in the light emission layer 132. The second semiconductor layer 133 according to an aspect of the present disclosure may be formed of a p-GaN semiconductor material. The p-GaN semiconductor material may be GaN, AlGaN, InGaN, or AlInGaN. The impurity that can be used for doping the second semiconductor layer 133 may be Mg, Zn, Be, or the like.

The first semiconductor layer 131 provides electrons to the light emission layer 132. The first semiconductor layer 131 according to an aspect of the present disclosure may be formed of an n-GaN-based semiconductor material. The n-GaN semiconductor material may be GaN, AlGaN, InGaN, or AlInGaN. Here, the impurities that can be used for doping the first semiconductor layer 131 may be Si, Ge, Se, Te, or C.

The light emission layer 132 is provided on the first semiconductor layer 131. Such light emission layer 132 has a multi quantum well (MQW) structure having a well layer and a barrier layer having a higher bandgap than that of the well layer. The light emission layer 132 according to an aspect of the present disclosure may have a multiple quantum well structure such as InGaN/GaN or the like.

The first electrode E1 is electrically connected to the second semiconductor layer 133 and is connected to the drain electrode DE or the source electrode SE of the driving transistor TFT which is a driving thin film pixel. The second electrode E2 is connected to the common power supply CL.

The first electrode E1 may be a p-type electrode and the second electrode E2 may be an n-type electrode. This can be classified depending on whether electrons are supplied or holes are supplied, that is, whether they are electrically connected to the p-type semiconductor layer or connected to the n-type semiconductor layer. Hereinafter, it will be described as the first electrode E1 and the second electrode E2 in the specification.

Each of the first and second electrodes E1 and E2 according to an aspect of the present disclosure may include a metal material such as Au, W, Pt, Si, Ir, Ag, Cu, Ni, Ti, or the like. Each of the first and second electrodes E1 and E2 may be made of a transparent conductive material. The transparent conductive material may be indium tin oxide (ITO) or indium zinc oxide (IZO). But the present disclosure is not limited thereto.

The insulating layer 134 covers the outside of the light emission element 130 and is opened at least a part of the first electrode E1 and the second electrode E2. The insulating layer 134 can be disposed of a material such as SiNx or SiOx and is arranged to cover the light emission layer 132.

In order to electrically connect the first electrode E1 and the second electrode E2 in the light emission element 130, the insulating layer 134 is provided for preventing unintended electrical connection when disposing the electrodes to connect. In order to increase the light efficiency of the light emission element 130 and prevent color mixing, the light emission element 130 may be surface-treated to reflect light, or may be blackened.

The light emission element 130 according to an aspect of the present disclosure further includes a concave portion 120. The light emission layer 132 disposed along the concave portion 120 is adjusted in accordance with the concave shape of the concave portion 120 so that the light efficiency of the light emission element 130 can be increased.

The concave portion 120 forms a basic shape for epitaxial growth of the first semiconductor layer 131 of the light emission element 130 and then forming a concave portion 120 through a process such as etching. Thereafter, the light emission layer 132 and the second semiconductor layer 133 may be disposed inside the concave portion 120 by using a selective epitaxial growth process method or the like.

Thus, the light emission layer 132 and the second semiconductor layer 133 can be disposed along the concave shape of the concave portion 120. The concave shape of the concave portion 120 having a wider width at upper portion thereof may be a rhombus shape, a square shape, a triangular shape, and a semicircular shape.

The viewing angle of the display device using the light emission element 130 may vary according to the depth H1 of the concave portion 120. The light emission layer 132 and the second semiconductor layer 133 are disposed inside the concave portion 120 in order to optimize the adjustment effect of the viewing angle. Further, the viewing angle of the display device can be adjusted using a partial positioning method, for example, only at a part of the lowest portion of the concave portion.

It is also possible to adjust the viewing angle and increase the light efficiency according to the inclination(?) of one side of the concave portion 120, in addition to the depth H1 of the concave portion 120. The most efficient slope (?) can be adjusted in association with the depth H1 of the concave portion 120 by 30 to 60 degrees, and the optimum angle can be changed according to the correlation between them.

As described above, the light emission element 130 emits light according to the recombination of electrons and holes according to the current flowing between the first electrode E1 and the second electrode E2. Hereinafter, the mechanism of light emission in the light emission layer 132 along the concave shape of the concave portion 120 of the light emission element 130 will be described.

The first semiconductor layer 131 and the second semiconductor layer 133 are grown on the surface to be grown with the single crystal layer, and thus the crystal direction is uniformly arranged along the surface to be grown. Accordingly, electrons and holes flow first in the horizontal directions D1 and D3 in the flow of charges in the first electrode E1 and the second electrode E2, and flows in the longitudinal direction D2 and D4.

This causes charge to be spread according to the crystal orientation of the first semiconductor layer 131 and the second semiconductor layer 133 which are epitaxially grown. The direction of the lattice of the molecular structure of the first semiconductor layer 131 and the second semiconductor layer 133 is parallel to the etched surface, and the charge flows accordingly. That is, it is possible to uniformly emit light in the entire region of the concave portion.

According to the flow of the electric charges described above, light is emitted in accordance with the combination of electrons and holes that are transmitted to the light emission layer 132. A relatively uniform charge is applied to the light emission layer 132 disposed along the concave shape of the concave portion 120. Accordingly, light is emitted along the shape of the concave portion 120, and thus, the light efficiency of the light emission device 120 can be increased.

The light efficiency is increased because the light emission layer 132 is disposed along the concave shape as described above, so that the light emission layer 132 can have a wider light emitting area than the conventional arrangement in a planar area. Accordingly, the amount of the emitted light is changed, so that the light efficiency can be increased.

Figure 6A:
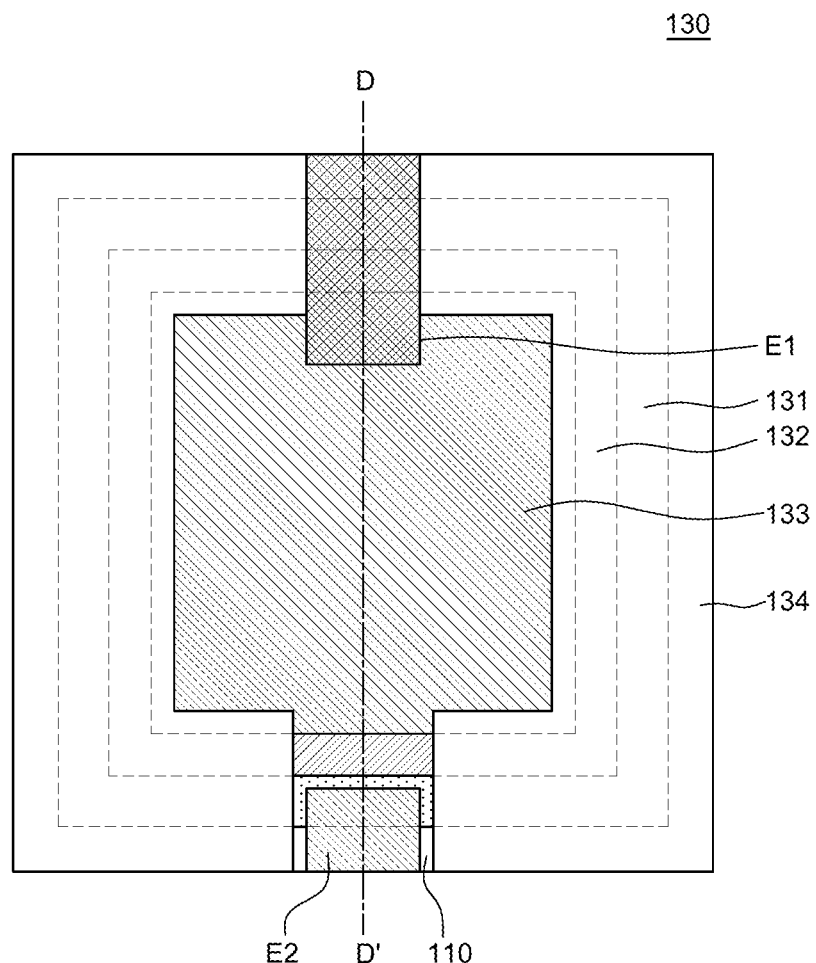
FIG. 6A is a schematic view illustrating a light emission element according to another aspect of the present disclosure.
Figure 6B:
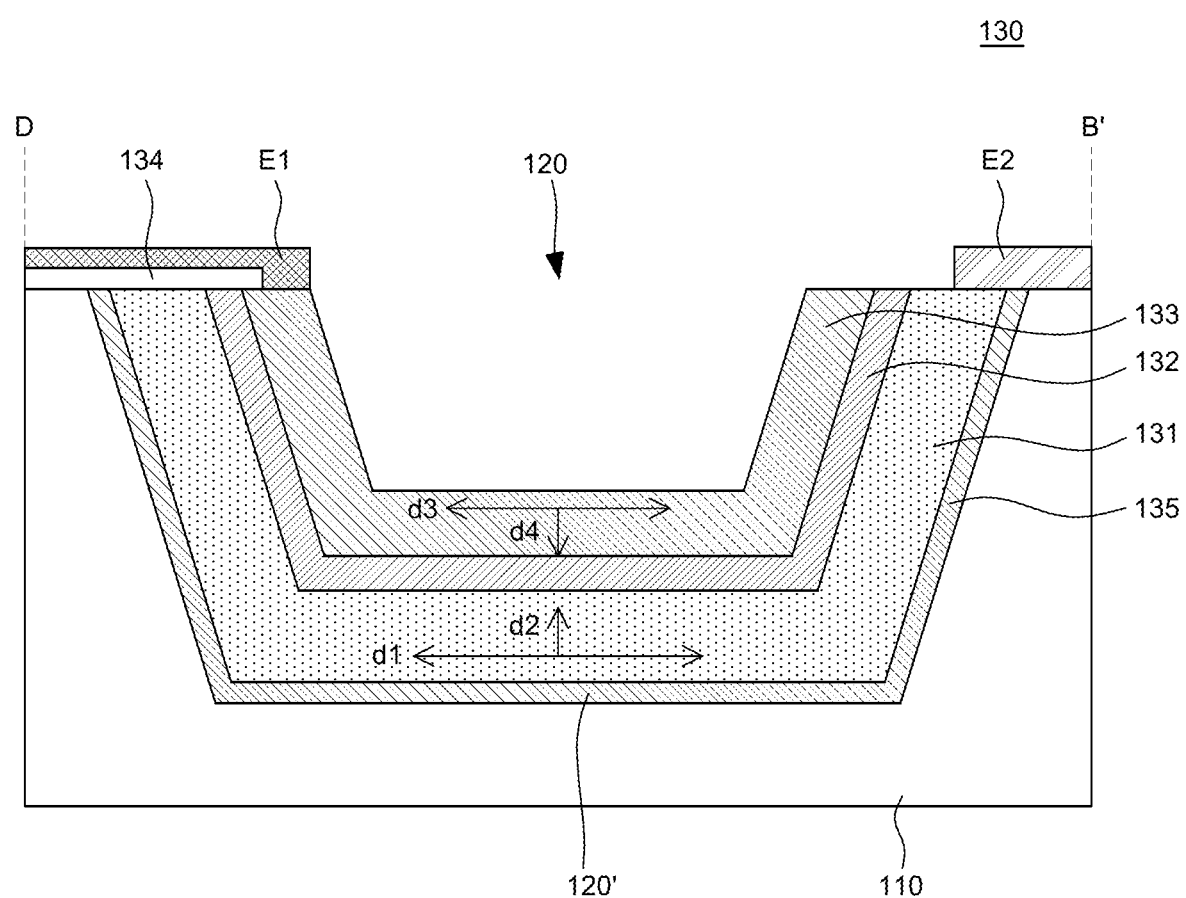
FIG. 6B is a schematic cross-sectional view taken along the line D-D' of FIG. 6A for explaining a light emission element according to another aspect of the present disclosure.

FIG. 6A is a schematic view illustrating a light emission element according to another aspect of the present disclosure. FIG. 6B is a schematic cross-sectional view taken along the line D-D' of FIG. 6A for explaining a light emission element according to another aspect of the present disclosure.

A display device which does not require a transplant step of the light emission element 130 and a light emission element used therein have been described with reference to the previous drawings, which will be described in more detail with reference to FIGS. 6A and 6B.

The concave portion inducing a guide pattern 120' is disposed on the substrate 110 made of a wafer. The shape of the concave portion inducing guide pattern 120' may be various shapes such as a square shape, a rhombus shape, a semicircular shape, and the like, which may be the same shape as the shape of the concave portion 120.

A buffer layer 135 is disposed on the concave portion guide pattern 120'. The above-described buffer layer 135 is a layer for relieving stress caused by a difference in lattice constant and thermal expansion coefficient on a semiconductor substrate. The buffer layer 135 may be a metallic buffer layer 135. For example, the buffer layer 135 may be formed of a metal material such as a metal, an alloy of metals, a metal oxide, or a metal nitride.

The buffer layer 135 is closely related to the growth of each layer from the first semiconductor layer 131 to the second semiconductor layer 133, and it can be eventually grown in accordance with the concave shape of the concave portion guide pattern 120', thereby disposed in the concave portion 120 by the end.

As illustrated in the previous drawings, the flow of current supplied from the first electrode E1 and the second electrode E2 flows first in the direction of the lateral direction D1 and D3 and then flows in the direction of the longitudinal direction D2 and D4 such that electrons and holes are diffused to generate a current flow according to the molecular structure and the crystal direction of respective semiconductor layer.

As described above, electrons and holes are uniformly transferred to the light emission layer 132 and light can be emitted from the entire region of the light emission layer 132. Since the light emission element 130 is an element formed on the substrate 110 in the above-described configuration, a separate transplant process may be unnecessary, and a fine light emission element can be disposed, thereby realizing a display device with high integration of high resolution.

Figure 7:
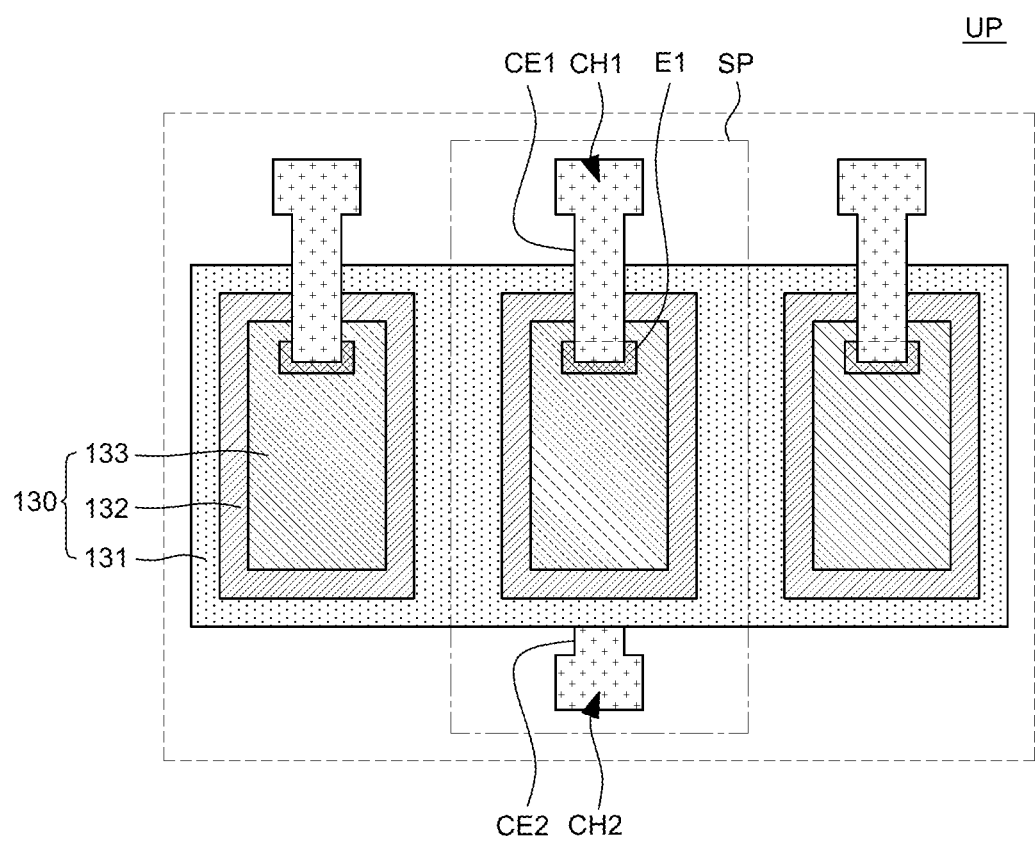
FIG. 7 is a view for explaining a display device having a light emission element according to an aspect of the present disclosure.

FIG. 7 is a view for explaining a display device having a light emission element according to an aspect of the present disclosure.

A plurality of light emission portions configured of the plurality of light emission layers 132 and the second semiconductor layers 133 can be arranged on the single first semiconductor layer 131 in view of the unit pixel UP. The plurality of first electrodes E1 may be arranged such that each of the light emission portions is driven as a separate pixel SP.

The second electrode E2 and the second connection electrode CE2 connected to the second electrode E2 are connected to the first semiconductor layer 131. The first semiconductor layer 131 is a common first semiconductor layer 131 connected to the plurality of light emission portions. Therefore, it is not necessary to dispose the second electrode E2 and the second connection electrode CE2 separately for each of the pixels SP.

As described above, the light emission element disposed in the unit pixel UP need not be disposed in each of the plurality of pixels SP in the unit pixel UP, but only one light emission element having a plurality of light emission portions may be disposed. Therefore, the transplant step of the light emission element can be reduced and thus, the productivity can be improved.

FIGS. 8A to 8F are schematic views for explaining various constructions for implementing various colors according to aspects of the present disclosure.

Aspects of a light emission element and a display device requiring a transplant process among various aspects of the present disclosure will be described with reference to FIGS. 8A to 8C. Aspects of a light emission element and a display device which do not require a transplant process will be described with reference to FIGS. 8D to 8F. However, two examples of the various aspects of the present disclosure are described and a more various aspect is possible.

A typical display device is configured to emit red, green, blue, and white light emitted by a pixel, and will be described accordingly.

Figure 8A:
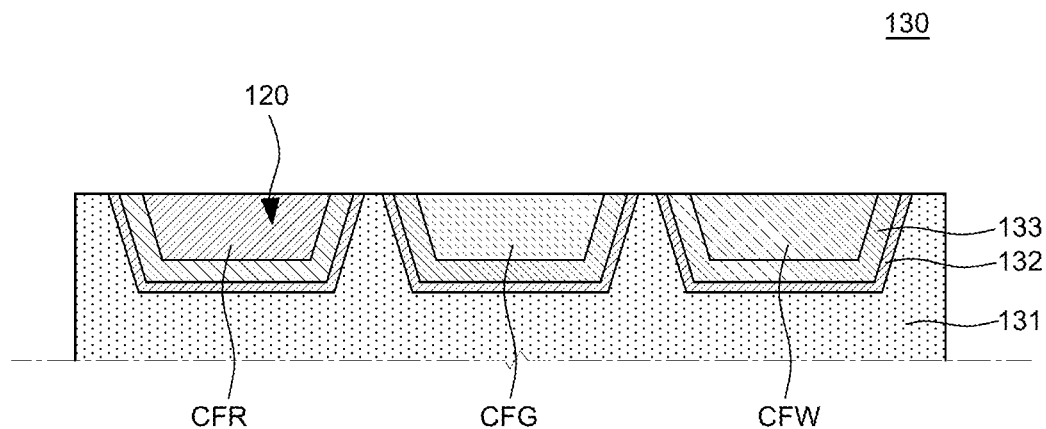
FIGS. 8A to 8F are schematic views for explaining various constructions for implementing various colors according to aspects of the present disclosure.

Referring to FIGS. 8A to 8F, the light emission element 130 may further include at least one concave portion 120 and may include a red color filter CFR, a green color filter CFG, a blue color filter CFB, a colorless color filter CFW, and a color conversion layer CCLW. Referring to FIG. 8A, the light emission element 130 may be a blue LED element emitting blue light. It is possible to arrange a plurality of concave portions in the blue LED element and to fill the concave portions 130 with a red color filter CFR, a green color filter CFG, and a colorless color filter CFW, thereby disposing a pixel of three primary colors. Therefore, an upper surface of the color filter is coplanar with upper surface of each of both ends of the first semiconductor layer, the light emission layer and the second semiconductor layer.

Figure 8B:
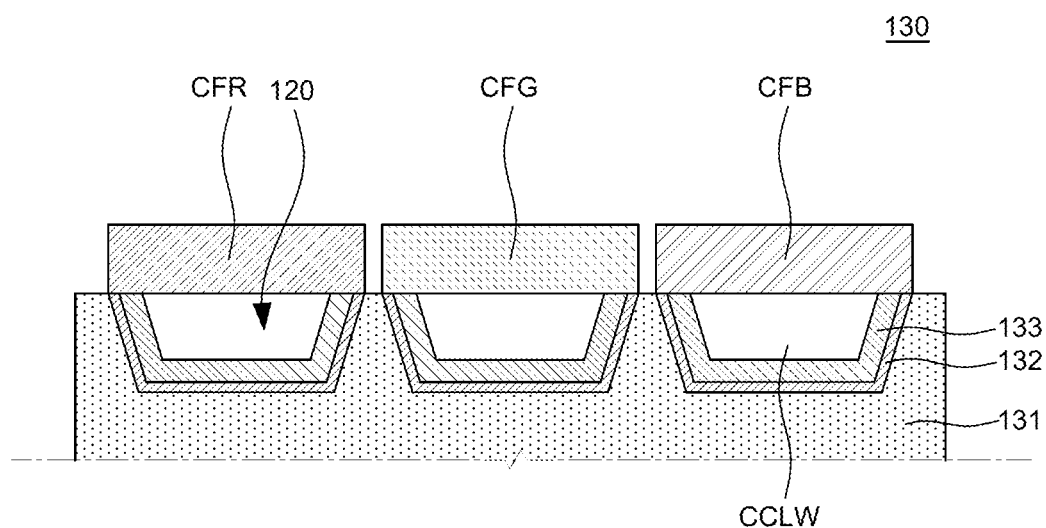

Referring to FIG. 8B, the light emission layer of the light emission element 130 may be a blue LED including a quantum well that emits blue light. A plurality of concave portions 120 are arranged in the light emission element 130 and the color conversion layer CCLW is filled in each of the concave portions 120 so that the light emitted from the light emission element 130 is changed to wavelengths of white color. On the other hand, by arranging the red color filter CFR, the green color filter CFG and the blue color filter CFB on the respective concave portions 120, a pixel of the primary three colors can be arranged. Therefore, an upper surface of the color conversion layer is coplanar with upper surface of each of both ends of the first semiconductor layer, the light emission layer and the second semiconductor layer.

Figure 8C:
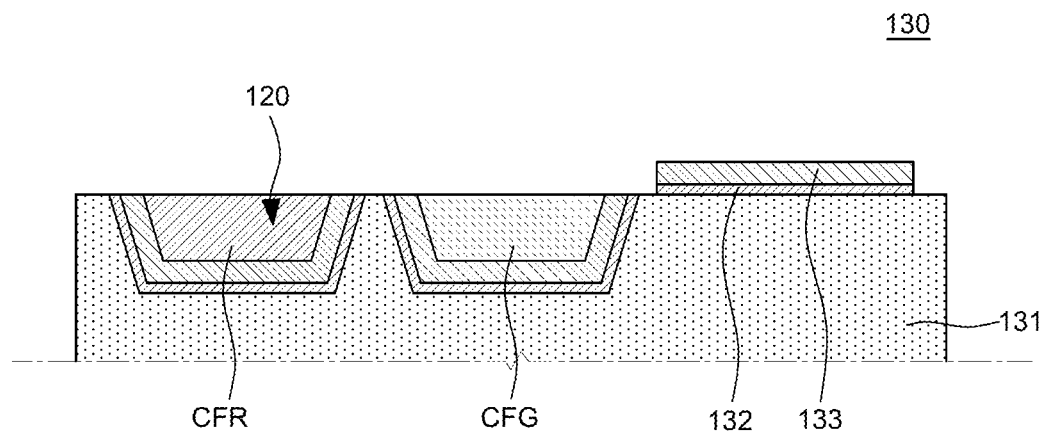

Referring to FIG. 8C, the light emission element 130 includes concave portions 120 filled with a red color filter CFR and a green color filter CFG. The light emission element 130 may be an LED element emitting basic blue light. In a pixel region emitting blue light, a light emission layer and the like are disposed on a plane, and not disposed in the concave portions 120. Therefore, the pixels of the primary three colors can be arranged. As described above, a pixel including the concave portions 120 and a pixel not including the concave portion 120 can be used together.

Figure 8D:
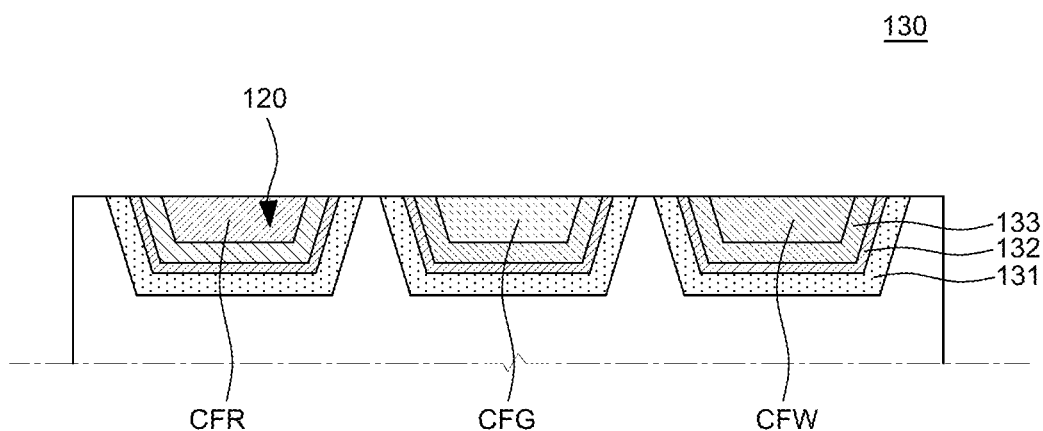

Referring to FIG. 8D, the light emission element 130 may include a plurality of concave portions 120 disposed on the substrate 110, and each of the concave portions may be configured to emit blue light. It may have a structure, in which two concave portions 120 of each concave portion 120 are filled with a red color filter CFR and a green color filter CFG, respectively, and one concave portion 120 is filled with a colorless color filter CFW.

Figure 8E:
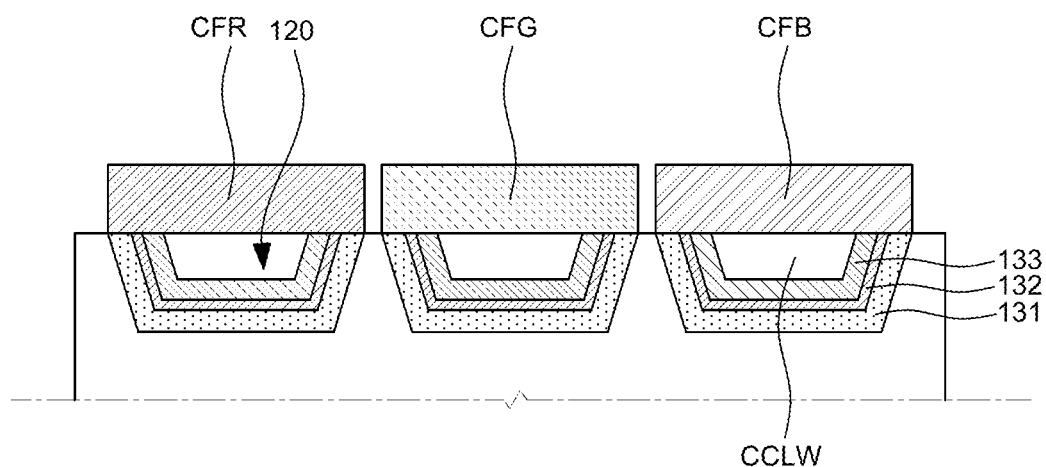

Referring to FIG. 8E, a plurality of concave portions 130 may be disposed on the substrate 110, and each of the concave portions 130 may include a color conversion layer CCLW. The light emitted from each concave portion may be configured to emit blue light, and the color conversion layer CCLW may be a color conversion layer that converts light emitted from the concave portion 120 into wavelengths of white light. On the other hand, a red color filter CFR, a green color filter CFG, and a blue color filter CFB can be arranged on the concave portions 120, respectively. Thus, a pixel of the primary three colors can be arranged.

Figure 8F:
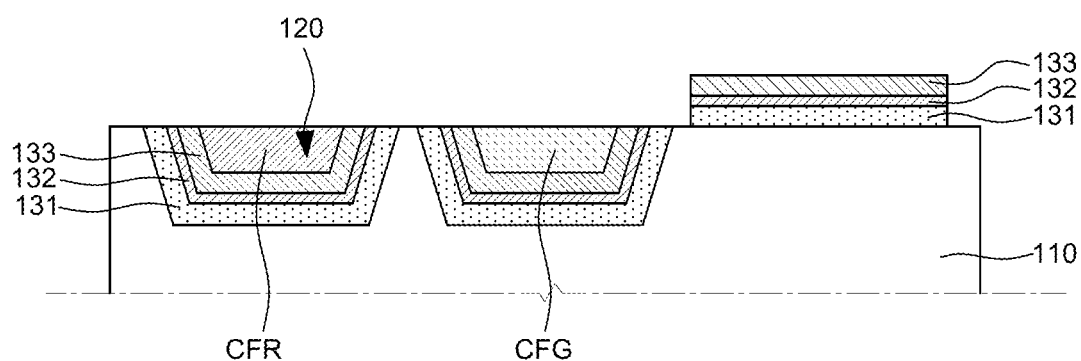

Referring to FIG. 8F, at least one concave portion 120 and a red color filter CFR, a green color filter CFG, or a blue color filter CFB filling the concave portion 120 may be included. It is possible to further include a pixel not including the concave portion 120 described above and a pixel of primary three colors can be implemented by various methods using the color filter or the like.

Although the aspects of the present disclosure have been described in detail with reference to the accompanying drawings, it is to be understood that the present disclosure is not limited to those aspects and various changes and modifications may be made without departing from the scope of the present disclosure. Therefore, the aspects disclosed in the present disclosure are intended to illustrate rather than limit the scope of the present disclosure, and the scope of the technical idea of the present disclosure is not limited by these aspects. Therefore, it should be understood that the above-described aspects are illustrative in all aspects and not restrictive. The scope of the present disclosure should be construed according to the claims, and all technical ideas within the scope of equivalents should be construed as falling within the scope of the present disclosure.

What is claimed is:

1. A light emission element including:
a first semiconductor layer having at least one concave portion;
a light emission layer disposed along the at least one concave portion;
a second semiconductor layer disposed on the light emission layer that is disposed along the at least one concave portion; and
a color filter or a color conversion layer disposed on the second semiconductor layer inside the concave portion,
wherein the light emission layer and the second semiconductor layer are disposed on the first semiconductor layer inside the concave portion, and
wherein an upper surface of the color filter or the color conversion layer is coplanar with upper surfaces of the first semiconductor layer, the light emission layer and the second semiconductor layer.

2. The light emission element of claim 1, further comprising a wafer substrate supporting the first semiconductor layer.

3. The light emission element of claim 2, further comprising a concave portion guide pattern corresponding to the concave portion and disposed on the wafer substrate.

4. The light emission element of claim 3, wherein the first semiconductor layer is disposed along the concave portion guide pattern on the wafer substrate.

5. The light emission element of claim 1, wherein the color filter is at least one of a red color filter, a green color filter, a blue color filter and a colorless color filter.

6. The light emission element of claim 1, wherein the light emission layer is configured to emit blue light.

7. The light emission element of claim 1, further comprising a reflective layer under the first semiconductor layer.

8. The light emission element of claim 1, wherein the color filter is disposed on the color conversion layer when the color conversion layer is filled in the concave portion.

9. A display device comprising:
at least one driving element and at least one light emission element on a substrate,
wherein the light emission element includes at least one light emission portion,
wherein the light emission portion includes a first semiconductor layer, a light emission layer on the first semiconductor layer, a second semiconductor layer on the light emission layer, and a color filter or a color conversion layer disposed on the second semiconductor layer,
wherein the light emission portion includes a concave portion,
wherein the light emission layer, the second semiconductor layer and the color filter or the color conversion layer are sequentially disposed on the first semiconductor layer inside the concave portion, and
wherein an upper surface of the color filter or the color conversion layer is coplanar with upper surface of each of both ends of the first semiconductor layer, the light emission layer and the second semiconductor layer.

10. The display device of claim 9, wherein the concave portion has at least one of a square shape, an inverted trapezoid shape, and a semicircular shape in cross-section.

11. The display device of claim 9, wherein the color filter is at least one among a red color filter, a green color filter, a blue color filter and a colorless color filter.

12. The display device of claim 9, wherein the color filter is disposed on the color conversion layer in the concave portion when the color conversion layer is filled in the concave portion.

13. The display device of claim 9, wherein the light emission layer is configured to emit blue light.

14. The display device of claim 9, wherein the light emission element further comprises a first electrode connected to the first semiconductor layer and a second electrode connected to the second semiconductor layer.

15. The display device of claim 14, wherein the light emission element includes a plurality of light emission portions,
wherein the first electrode is a common electrode commonly connected to the first semiconductor layer of the plurality of light emission portions, and
wherein the second electrode is a plurality of individual electrodes respectively connected to the second semiconductor layer of the plurality of light emission portions.

16. A light emission element including:
a first semiconductor layer having a concave portion;
a light emission layer disposed on the first semiconductor layer;
a second semiconductor layer disposed on the light emission layer;
a first electrode disposed outside the concave portion and connected to the first semiconductor layer;
a second electrode connected to the second semiconductor layer;
a color filter or a color conversion layer disposed on the second semiconductor layer,
wherein an upper surface of the color filter or the color conversion layer is coplanar with upper surfaces of the first semiconductor layer, the light emission layer and the second semiconductor layer.

17. The light emission element of claim 16, further comprising a wafer substrate supporting the first semiconductor layer.

18. The light emission element of claim 17, further comprising a concave portion guide pattern corresponding to the concave portion and disposed on the wafer substrate.

19. The light emission element of claim 16, further comprising a reflective layer under the first semiconductor layer.

20. The light emission element of claim 16, wherein the color filter disposed on the color conversion layer when the color conversion layer is filled in the concave portion.

* * * * *